United States Patent
Uemura et al.

(10) Patent No.: US 9,251,905 B2
(45) Date of Patent: Feb. 2, 2016

(54) SEMICONDUCTOR INTEGRATED CIRCUIT INCLUDING A VOLTAGE BOOSTING OR LOWERING CIRCUIT

(71) Applicant: KABUSHIKI KAISHA TOSHIBA, Toyko (JP)

(72) Inventors: Masafumi Uemura, Kanagawa (JP); Masaru Koyanagi, Tokyo (JP); Masahiro Yoshihara, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 206 days.

(21) Appl. No.: 14/016,005

(22) Filed: Aug. 30, 2013

(65) Prior Publication Data

US 2014/0286091 A1    Sep. 25, 2014

(30) Foreign Application Priority Data

Mar. 25, 2013    (JP) .................. 2013-062124

(51) Int. Cl.
*G11C 16/30* (2006.01)
*G11C 16/12* (2006.01)
*G11C 16/04* (2006.01)

(52) U.S. Cl.
CPC ............ *G11C 16/30* (2013.01); *G11C 16/0483* (2013.01); *G11C 16/12* (2013.01)

(58) Field of Classification Search
CPC ...... G11C 16/30; G11C 16/0483; G11C 16/12
See application file for complete search history.

(56) References Cited

U.S. PATENT DOCUMENTS

| 6,163,483 | A  | * | 12/2000 | Pasotti et al. ............ 365/185.19 |
| 7,573,252 | B1 | * | 8/2009  | Griesert ..................... 323/315  |
| 8,026,702 | B2 |   | 9/2011  | Tanzawa                               |

FOREIGN PATENT DOCUMENTS

| JP | 07-003760 B   | 1/1995  |
| JP | 2002-251891 A | 9/2002  |
| JP | 2009-301087 A | 12/2009 |

* cited by examiner

*Primary Examiner* — John H. Hur
(74) *Attorney, Agent, or Firm* — Patterson & Sheridan, LLP

(57) ABSTRACT

A semiconductor integrated circuit includes a reference voltage generation circuit configured to generate a reference voltage, and a voltage changing circuit configured to generate a second voltage from a first voltage based on a difference between the second voltage and the reference voltage and apply the second voltage to a load capacitance. The reference voltage generation circuit includes a variable current source and a capacitor which are connected in series and is configured to change the reference voltage linearly.

10 Claims, 14 Drawing Sheets

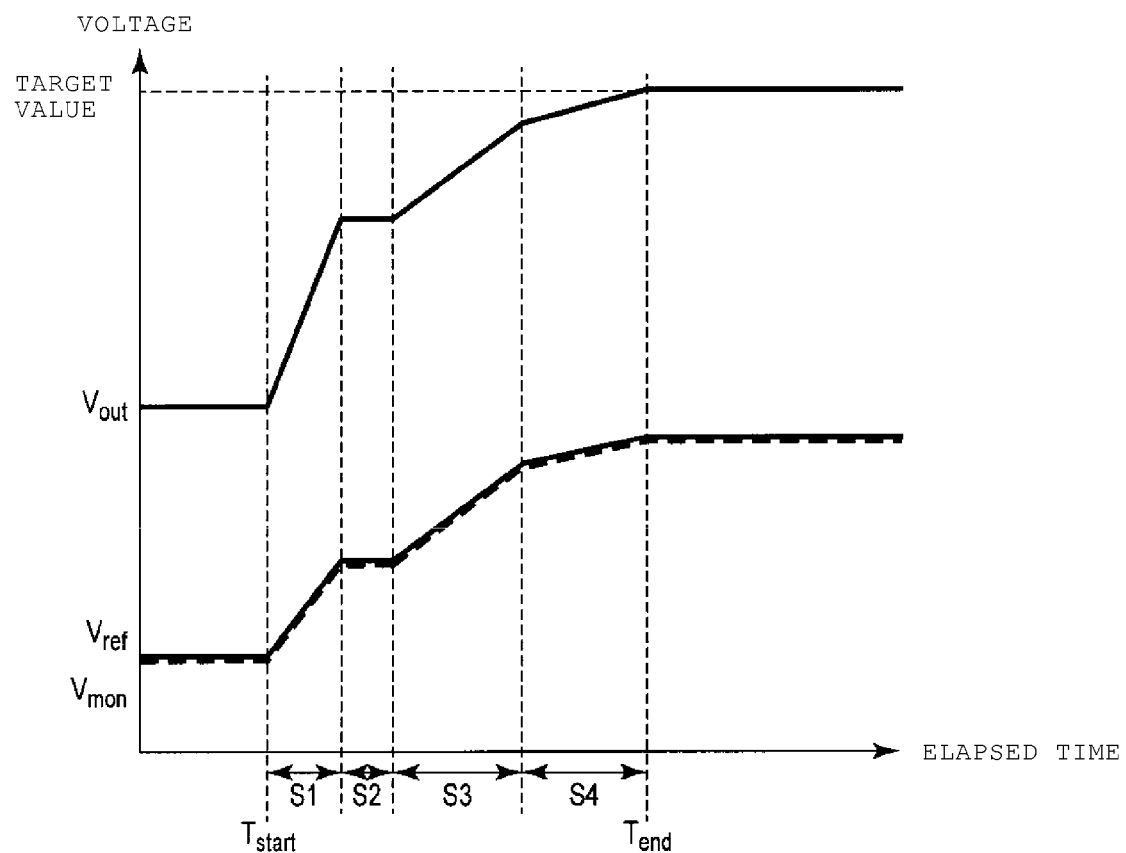

US 9,251,905 B2

SEMICONDUCTOR INTEGRATED CIRCUIT INCLUDING A VOLTAGE BOOSTING OR LOWERING CIRCUIT

CROSS-REFERENCE TO RELATED APPLICATION

This application is based upon and claims the benefit of priority from Japanese Patent Application No. 2013-062124, filed Mar. 25, 2013, the entire contents of which are incorporated herein by reference.

FIELD

Embodiments described herein relate generally to a semiconductor integrated circuit.

BACKGROUND

Maintaining a constant boosting rate of a voltage boosting circuit used in a semiconductor integrated circuit is an important factor for ensuring the reliability of the semiconductor integrated circuit. However, recently, it has become difficult to maintain a constant boosting rate of voltage boosting circuits. For example, in a nonvolatile semiconductor memory circuit, a load capacitance which is connected to an output terminal of the voltage boosting circuit varies by a large amount in accordance with the number of selected planes of memory cells. In such a case, accurately controlling the boosting rate of the voltage boosting circuit may be very difficult.

DESCRIPTION OF THE DRAWINGS

FIG. 4 is a graph showing a second example of the relationship between the reference voltage and the output voltage.

DETAILED DESCRIPTION

Figure 1:
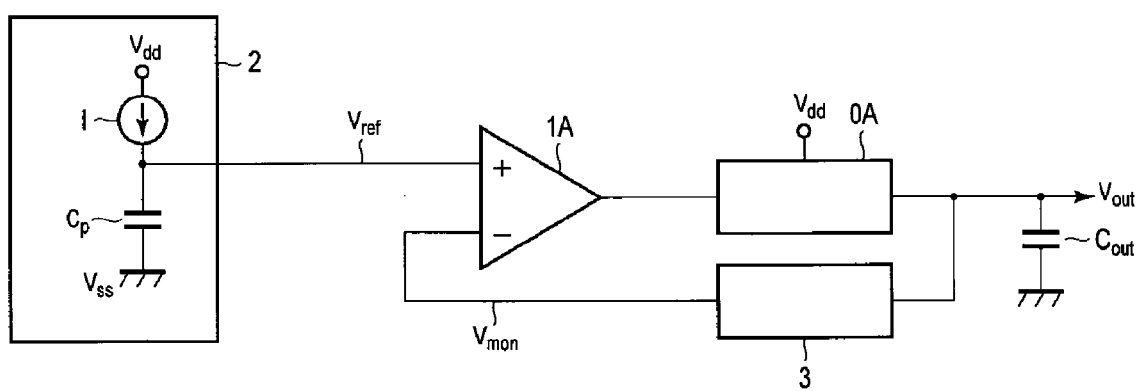
FIG. 1 is a block diagram showing a semiconductor integrated circuit according to a first embodiment.

Embodiments provide a technique which controls a boosting rate of a voltage outputted from a voltage boosting or lowering circuit with high accuracy.

In general, according to one embodiment, a semiconductor integrated circuit includes a reference voltage generation circuit configured to generate a reference voltage, and a voltage changing circuit configured to generate a second voltage from a first voltage based on a difference between the second voltage and the reference voltage and apply the second voltage to a load capacitance. The reference voltage generation circuit includes a variable current source and a capacitor which are connected in series and is configured to change the reference voltage linearly.

Hereinafter, embodiments are explained in conjunction with drawings.

Embodiments explained hereinafter are directed to a semiconductor integrated circuit which includes a voltage boosting or lowering circuit which generates a second voltage (for example, boosted voltage or lowered voltage) from a first voltage (for example, an internal power source voltage, an external power source voltage or the like), and applies the second voltage to a load capacitance.

The operation of the voltage boosting or lowering circuit is also restricted by a differential amplifier circuit which compares the second voltage or a third voltage obtained by dividing the second voltage with the reference voltage, for example.

In such a semiconductor integrated circuit, a reference voltage generation circuit which generates a reference voltage includes a variable current source and a capacitor which are connected in series. By supplying a constant current to the capacitor from the variable current source, the reference voltage is linearly changed and a change rate of the second voltage (a change rate of a voltage outputted from the voltage boosting or lowering circuit) is made to follow a change rate of the reference voltage.

To make a change rate of the second voltage follow a change rate of the reference voltage means that a voltage boosting condition (e.g., a change rate of the reference voltage, current supply capability of the voltage boosting or lowering circuit, the load capacitance or the like, for example) is set such that the second or third voltage which is a feedback voltage is brought into a state where the second or third voltage exceeds the reference voltage.

That is, when the second or third voltage is in a state where the second or third voltage exceeds the reference voltage, the operation of the voltage boosting or lowering circuit is restricted by the differential amplifier circuit so that the second or third voltage is always maintained in a state where the second or third voltage is equal to or substantially equal to the reference voltage. Accordingly, the change rate of the second voltage follows the change rate of the reference voltage.

The technique adopted by this embodiment differs from the technique where a change rate of the reference voltage is changed based on a CR (Capacitance and Resistivity) time constant. When the change rate of the reference voltage is controlled based on the CR time constant, the change rate of the reference voltage takes a non-linear shape with respect to an elapsed time. To the contrary, in this embodiment, with the supply of a constant current to the capacitor from the variable current source, the reference voltage is changed linearly.

In this manner, by controlling the reference voltage using the variable current source, a change rate of a voltage outputted from the voltage boosting or lowering circuit can be controlled with high accuracy.

For example, according to this embodiment, with the supply of a constant current to the capacitor from the variable current source in a first mode, a change rate of a reference voltage can be controlled to a constant value during a period from a point of time at which boosting or lowering of a second voltage is started to a point of time at which the second voltage reaches a target value. Further, by changing an electric current supplied from the variable current source in a second mode, a change rate of a reference voltage can be also controlled variably during the period from the point of time at which boosting or lowering of the second voltage is started to the point of time at which the second voltage reaches the target value.

Recently, a nonvolatile semiconductor memory circuit with a large capacitance has an architecture where a memory cell array is divided into a plurality of planes, and at least one of the plurality of planes is selected corresponding to an operation mode. In such a case, a load capacitance of a voltage boosting or lowering circuit changes depending on the number of selected planes (the number of selected planes being one or more).

In such a state, for example, by setting a plurality of operation modes corresponding to the number of selected planes (the number of selected planes being one or more), and by controlling a change rate of a reference voltage corresponding to each operation mode, a change rate of a second voltage which is an output voltage of a voltage boosting or lowering circuit can be always set at a constant value without making the change rate of the second voltage dependent on a change of the load capacitance, for example.

1. First Embodiment

FIG. 1 shows a semiconductor integrated circuit according to the first embodiment.

A voltage boosting circuit 0A generates a second voltage (output voltage) $V_{out}$ from a first voltage (an internal power source voltage, for example) $V_{dd}$, and applies the second voltage $V_{out}$ to a load capacitance $C_{out}$. A voltage divider circuit 3 generates a third voltage (a monitor voltage) $V_{mon}$ by dividing the second voltage $V_{out}$. A differential amplifier circuit 1A restricts the operation of the voltage boosting circuit 0A based on a comparison between the third voltage $V_{mon}$ and a reference voltage $V_{ref}$.

In this embodiment, the differential amplifier circuit 1A compares the third voltage $V_{mon}$ and the reference voltage $V_{ref}$ with each other. However, in an alternative embodiment, the voltage divider circuit 3 may be omitted, and the differential amplifier circuit 1A may compare the second voltage $V_{out}$ and the reference voltage $V_{ref}$ with each other.

A reference voltage generation circuit 2 generates the reference voltage $V_{ref}$. The reference voltage generation circuit 2 includes a variable current source I and a capacitor Cp which are connected in series, and controls a change rate of the reference voltage $V_{ref}$ by supplying a constant current to the capacitor Cp from the variable current source I. Due to such a control, a change rate (boosting rate) of the second voltage $V_{out}$ is made to follow a change rate of the reference voltage $V_{ref}$.

To make a change rate of the second voltage $V_{out}$ follow a change rate of the reference voltage $V_{ref}$ in this manner, as described previously, a voltage boosting condition (e.g., a change rate of reference voltage $V_{ref}$, current supply capability of voltage boosting circuit 0A, a load capacitance $C_{out}$ or the like, for example) is set such that the third voltage $V_{mon}$, which is a feedback voltage, is brought into a state where the third voltage $V_{mon}$ exceeds the reference voltage $V_{ref}$.

Due to such voltage setting, a boosting rate can be controlled with high accuracy. For example, even when the load capacitance $C_{out}$ connected to an output terminal of the voltage boosting circuit 0A changes corresponding to an operation mode, the boosting rate can be maintained at a constant value regardless of an operation mode.

Figure 2A:
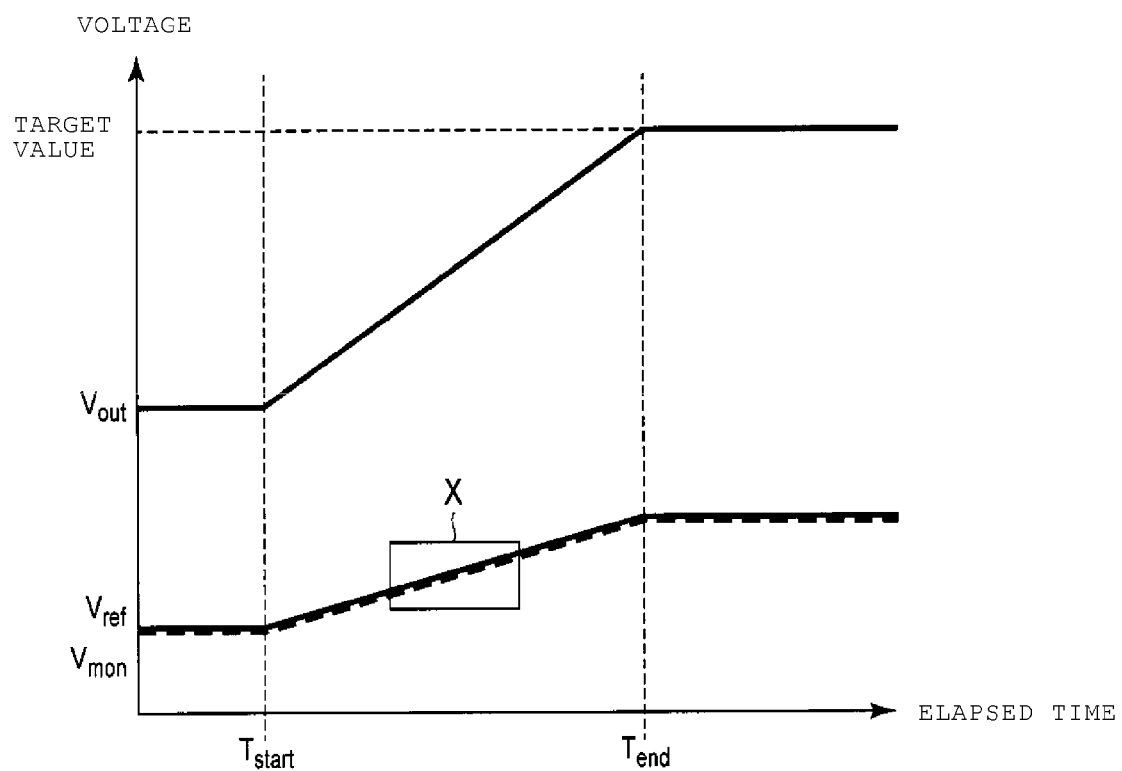
FIG. 2A is a graph showing a first example of the relationship between a reference voltage and an output voltage.
Figure 2B:
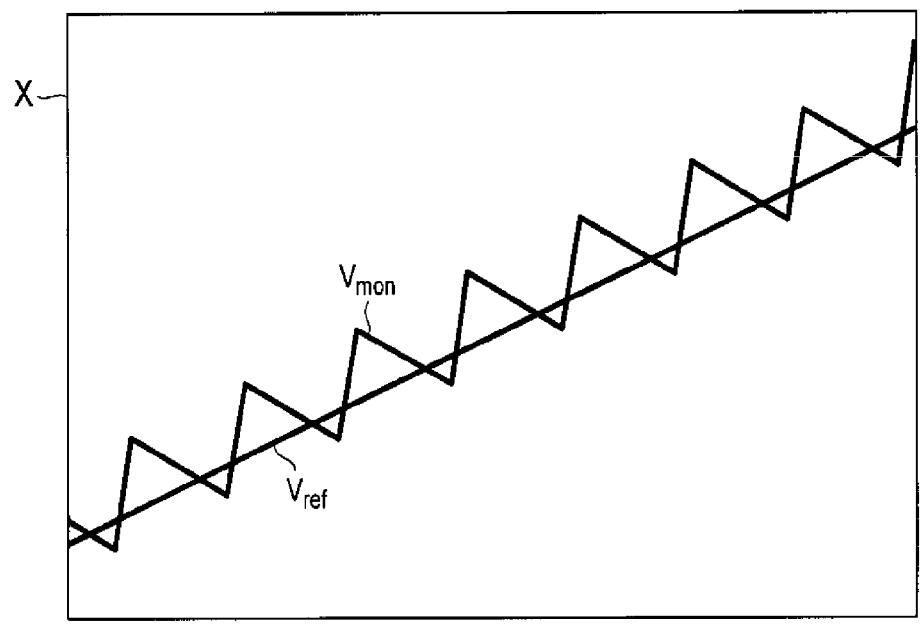
FIG. 2B is a graph showing the relationship between the reference voltage and a monitored voltage.

FIG. 2A and FIG. 2B show a first example of the relationship between a change rate of the reference voltage $V_{ref}$ and a change rate of the second voltage $V_{out}$ in the semiconductor integrated circuit shown in FIG. 1.

Such a relationship is established when a change rate of the reference voltage $V_{ref}$ is controlled to a constant value during a period from a point of time at which boosting of a second voltage (a boost voltage, for example) $V_{out}$ is started, to a point of time at which the second voltage reaches a target value by maintaining an electric current supplied from a variable current source I at a constant value. An elapsed time is taken on an axis of abscissas, and a voltage is taken on an axis of ordinates.

As can be clearly understood from FIG. 2A and FIG. 2B, the change rate of the reference voltage $V_{ref}$ is constant, and the reference voltage $V_{ref}$ changes linearly. On the other hand, the second voltage $V_{out}$ is always restricted by the reference voltage $V_{ref}$ during a period from a point of time $T_{start}$ at which boosting of the second voltage $V_{out}$ is started to a point of time $T_{end}$ at which the second voltage $V_{out}$ reaches the target value.

That is, as shown in FIG. 2B, a voltage boosting condition (e.g., a change rate of the reference voltage, current supply capability of the voltage boosting circuit, a load capacitance or the like, for example) is set such that a third voltage $V_{mon}$ is brought into a state where the third voltage $V_{mon}$ exceeds the reference voltage $V_{ref}$.

In this case, the operation of the voltage boosting circuit is restricted by the differential amplifier circuit so that the third voltage $V_{mon}$ always maintains a state where the third voltage $V_{mon}$ is equal to or substantially equal to the reference voltage $V_{ref}$. Accordingly, the second voltage $V_{out}$ is boosted following the boosting of the reference voltage $V_{ref}$ until the second voltage $V_{out}$ reaches the target value.

For example, in a nonvolatile semiconductor memory circuit, it may be necessary for a second voltage $V_{out}$ which is an output voltage of a voltage boosting circuit to reach a target value within a period from a point of time at which a write or erase operation instruction is received to a point of time at which the write or erase operation is executed (the elapsed time known as latency).

Figure 3A:
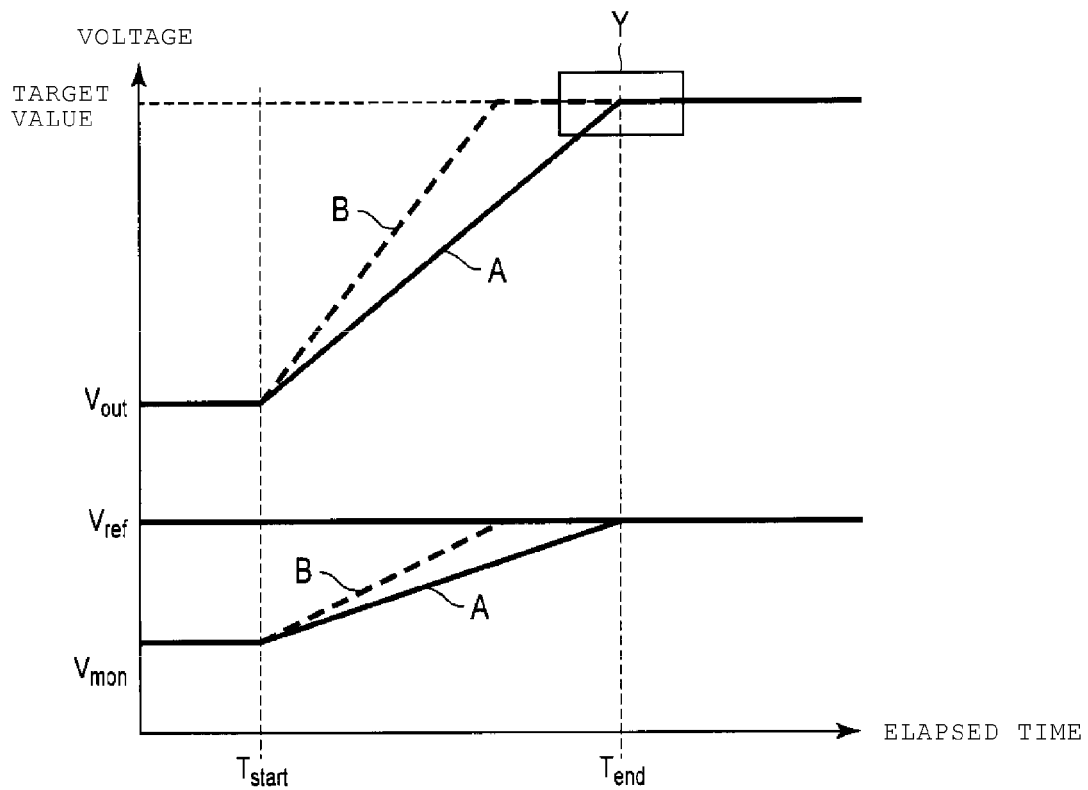
FIG. 3A is a graph showing the relationship between a reference voltage and an output voltage in a comparison example.
Figure 3B:
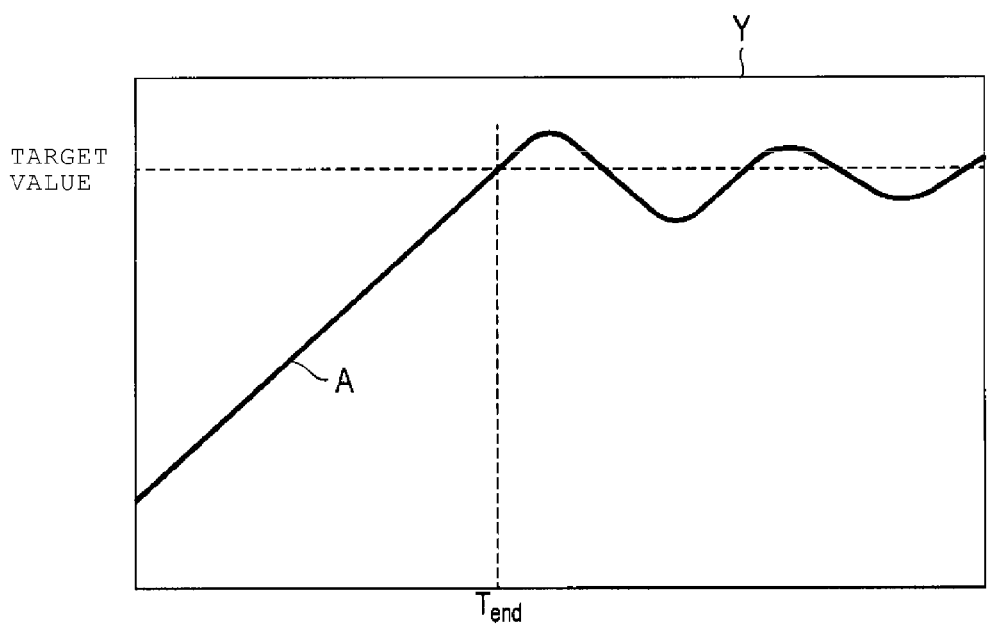
FIG. 3B is a graph showing an overshoot.

FIG. 3A and FIG. 3B show an example of the relationship between a change rate of a reference voltage $V_{ref}$ and a change rate of a second voltage $V_{out}$ in a comparison example.

The relationship shown in FIG. 3A differs from the relationship shown in FIG. 2A in that the reference voltage $V_{ref}$ is a constant value in the relationship shown in FIG. 3A.

In this case, the second voltage $V_{out}$ is not restricted by the reference voltage $V_{ref}$ during a period from a point of time $T_{start}$ at which boosting of the second voltage $V_{out}$ is started to a point of time $T_{end}$ at which the second voltage $V_{out}$ reaches a target value. The second voltage $V_{out}$ is restricted by the reference voltage $V_{ref}$ on and after the point of time $T_{end}$.

Accordingly, the change rate of the second voltage $V_{out}$ is determined based on current supply capability of the voltage boosting circuit and a load capacitance. Assuming that current supply capability of the voltage boosting circuit is constant, the change rate of the second voltage $V_{out}$ changes according to the load capacitance. For example, a solid line A indicates a case where a load capacitance which is connected to an output terminal of the voltage boosting circuit is large, and a broken line B indicates a case where a load capacitance which is connected to the output terminal of the voltage boosting circuit is small.

The time needed for the second voltage $V_{out}$ to reach the target value is long when the load capacitance is large, and the time needed for the second voltage $V_{out}$ to reach the target value is short when the load capacitance is small. This delay in timing at which the second voltage $V_{out}$ reaches the target value is not desirable from a viewpoint of enhancing characteristics of the semiconductor integrated circuit.

As shown in FIG. 3B, when the reference voltage $V_{ref}$ is at a constant value, at the point of time $T_{end}$ at which the restriction of the second voltage $V_{out}$ by the reference voltage $V_{ref}$ starts, a so-called overshoot occurs. Such an overshoot generates an unintended large voltage stress on a gate insulation film of an element, for example, an FET (including a memory cell) in the semiconductor integrated circuit, and this voltage stress causes a failure such as breaking of the element.

To the contrary, as shown in FIG. 2A and FIG. 2B, by making the second voltage $V_{out}$ follow the reference voltage $V_{ref}$ until the second voltage $V_{out}$ reaches the target value, a drawback such as delay in timing at which the second voltage $V_{out}$ reaches such a target value or an overshoot can be eliminated.

FIG. 4 shows a second example of the relationship between the change rate of the reference voltage $V_{ref}$ and the change rate of the second voltage $V_{out}$ in the semiconductor integrated circuit shown in FIG. 1.

Such relationship is established when the change rate of the reference voltage $V_{ref}$ is variably controlled during a period from a point of time at which boosting of the second voltage (the boost voltage, for example) $V_{out}$ is started to a point of time at which the second voltage $V_{out}$ reaches the target value by changing an electric current supplied from the variable current source I. An elapsed time is taken on an axis of abscissas, and a voltage is taken on an axis of ordinates.

As can be clearly understood from FIG. 4, the second voltage $V_{out}$ is always restricted by the reference voltage $V_{ref}$ during the period from the point of time $T_{start}$ at which boosting of the second voltage $V_{out}$ is started to the point of time $T_{end}$ at which the second voltage $V_{out}$ reaches the target value.

This restriction is provided by setting a voltage boosting condition (e.g., the change rate of reference voltage, the current supply capability of the voltage boosting circuit, the load capacitance or the like, for example) such that the third voltage $V_{mon}$ is brought into a state where the third voltage $V_{mon}$ exceeds the reference voltage $V_{ref}$.

In this case, the operation of the voltage boosting circuit is restricted by the differential amplifier circuit so that the third voltage $V_{mon}$ is always maintained in a state where the third voltage $V_{mon}$ is equal to or substantially equal to the reference voltage $V_{ref}$. Accordingly, the second voltage $V_{out}$ is boosted following the boosting of the reference voltage $V_{ref}$ until the second voltage $V_{out}$ reaches the target value.

In this embodiment, the period from the point of time $T_{start}$ to the point of time $T_{end}$ is divided into 4 zones S1, S2, S3 and S4, and a change rate of the reference voltage $V_{ref}$ is changed from each other among these zones S1, S2, S3, S4. For example, the relationship of the change rate of the reference voltage $V_{ref}$ among the zones S1, S3, S4 is set to satisfy S3>S1>S4. The change rate of the reference voltage $V_{ref}$ in the zone S2 is set at 0.

The change rate of the reference voltage $V_{ref}$ is constant in each zone, and the reference voltage $V_{ref}$ changes linearly in each zone. Timing at which the change rate of the reference voltage $V_{ref}$ is changed is controlled by a timer circuit or the like.

The change rate of the reference voltage $V_{ref}$ which differs among respective zones can be realized by finely controlling a value of an electric current supplied from the variable current source I.

For example, in a nonvolatile semiconductor memory circuit, it may be necessary for the second voltage $V_{out}$, which is an output voltage of the voltage boosting circuit, to reach a target value within a period from a point of time that a write or erase operation instruction is received to a point of time that the write or erase operation is executed (the elapsed time known as latency).

As can be clearly understood from FIG. 2A, FIG. 2B and FIG. 4, according to this embodiment described heretofore, the change rate of the reference voltage $V_{ref}$ can be controlled with high accuracy during the period from the point of time at which boosting of the second voltage (the boost voltage, for example) $V_{out}$ is started to the point of time at which the second voltage $V_{out}$ reaches the target value.

Although the above-mentioned first embodiment is explained with respect to the voltage boosting circuit that outputs an increased voltage, a voltage lowering circuit may be configured in the same manner to output a decreased voltage. The detail of the voltage lowering circuit is explained in conjunction with the second embodiment.

2. Second Embodiment

Figure 5:
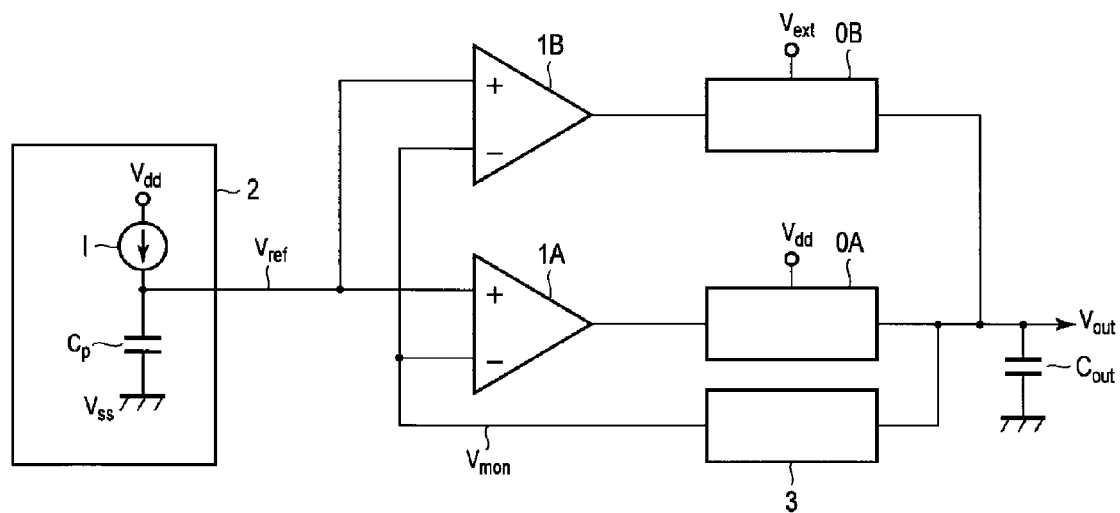
FIG. 5 is a block diagram showing a semiconductor integrated circuit according to a second embodiment.

FIG. 5 shows a semiconductor integrated circuit according to the second embodiment.

A voltage boosting circuit 0A generates a second voltage (an output voltage) $V_{out}$ from a first voltage (for example, an internal power source voltage) $V_{dd}$, and applies the second voltage $V_{out}$ to a load capacitance $C_{out}$. A voltage lowering circuit 0B generates a second voltage (an output voltage) $V_{out}$ from a first voltage (for example, an external power source voltage) $V_{ext}$, and applies the second voltage $V_{out}$ to a load capacitance $C_{out}$.

The first voltage which is an internal power source voltage $V_{dd}$ is a voltage of 5V or less, for example. In this case, a target value of the second voltage $V_{out}$ is a high voltage of 20V or more such as a write voltage. The first voltage which is the external power source voltage $V_{ext}$ is a voltage of 10V or more, for example. In this case, a target value of the second voltage $V_{out}$ is 5V or less such as a read voltage, for example.

A voltage divider circuit 3 generates a third voltage (monitor voltage) $V_{mon}$ by dividing the second voltage $V_{out}$. A differential amplifier circuit 1A restricts the operation of the voltage boosting circuit 0A based on a comparison between the third voltage $V_{mon}$ and the reference voltage $V_{ref}$. A differential amplifier circuit 1B restricts the operation of the voltage lowering circuit 0B based on a comparison between the third voltage $V_{mon}$ and the reference voltage $V_{ref}$.

In this embodiment, the differential amplifier circuits 1A, 1B compare the third voltage $V_{mon}$ and the reference voltage $V_{ref}$ with each other. However, in an alternative embodiment, the voltage divider circuit 3 may be omitted, and the differential amplifier circuits 1A, 1B may compare the second voltage $V_{out}$ and the reference voltage $V_{ref}$ with each other.

A reference voltage generation circuit 2 generates the reference voltage $V_{ref}$. The reference voltage generation circuit 2 includes a variable current source I and a capacitor Cp which are connected in series, and controls the change rate of the reference voltage $V_{ref}$ by supplying a constant current to the capacitor Cp from the variable current source I. Due to such a control, a change rate (boosting rate) of the second voltage $V_{out}$ is made to follow a change rate of the reference voltage.

To make the change rate of the second voltage $V_{out}$ follow the change rate of the reference voltage $V_{ref}$ in this manner, a voltage boosting condition (e.g., the change rate of the reference voltage $V_{ref}$, current supply capability of the voltage boosting circuit 0A, a load capacitance $C_{out}$ or the like, for example) is set such that a third voltage $V_{mon}$ which is a feedback voltage is brought into a state where the third voltage $V_{mon}$ exceeds the reference voltage $V_{ref}$.

A voltage lowering condition (e.g., the change rate of reference voltage $V_{ref}$, current supply capability of the voltage boosting circuit 0A, the load capacitance $C_{out}$ or the like, for example) is set such that the third voltage $V_{mon}$ which is the feedback voltage is brought into a state where the third voltage $V_{mon}$ is below the reference voltage $V_{ref}$.

Due to such voltage setting, a change rate of a voltage outputted from the voltage boosting or lowering circuit can be controlled with high accuracy. For example, even when the load capacitance $C_{out}$ connected to an output terminal of the voltage boosting circuit 0A or the voltage lowering circuit 0B changes corresponding to an operation mode, the change rate can be maintained at a constant value regardless of the operation mode.

Figure 6:
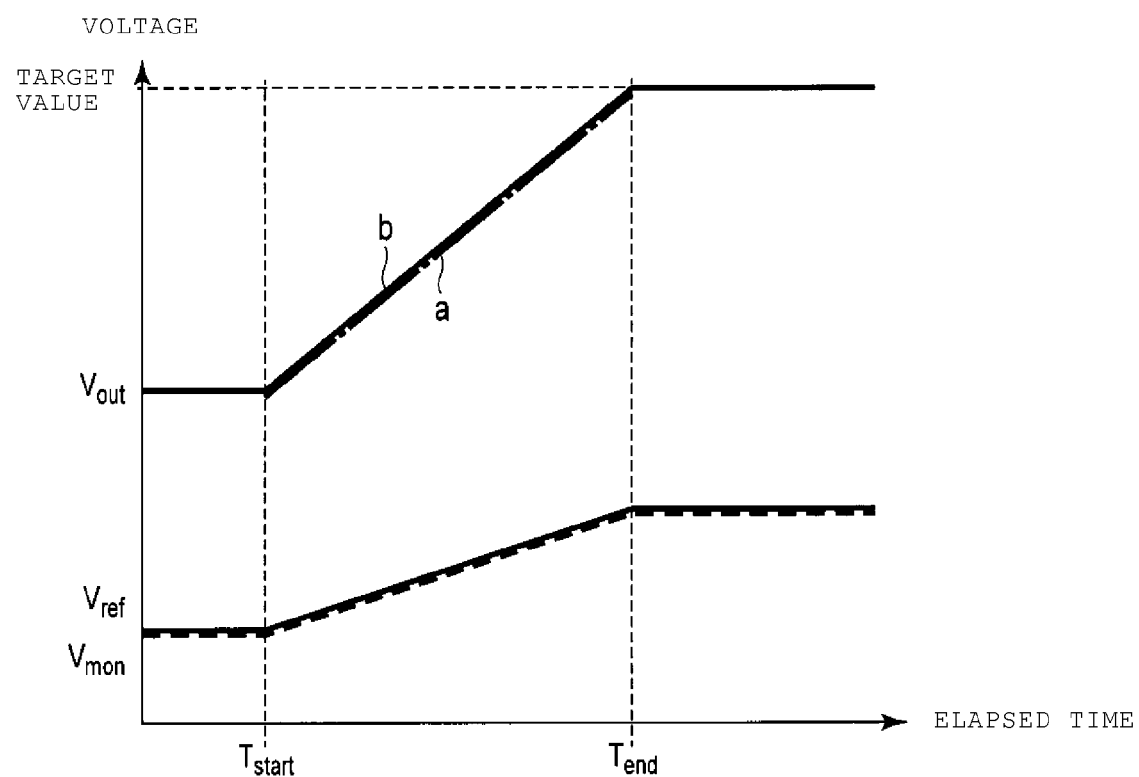
FIG. 6 is a graph showing an example of the relationship between a reference voltage and an output voltage in the second embodiment.

FIG. 6 shows an example of the relationship between the change rate of a reference voltage $V_{ref}$ and the change rate of a second voltage $V_{out}$ in the semiconductor integrated circuit shown in FIG. 5.

Such a relationship is established when the change rate of the reference voltage $V_{ref}$ is controlled to a constant value during a period from a point of time at which boosting of the second voltage (the boost voltage, for example) $V_{out}$ is started to a point of time at which the second voltage $V_{out}$ reaches a target value by changing an electric current supplied from a variable current source I. An elapsed time is taken on an axis of abscissas, and a voltage is taken on an axis of ordinates.

As can be clearly understood from FIG. 6, the change rate of the reference voltage $V_{ref}$ is first constant, and then the reference voltage $V_{ref}$ changes linearly. FIG. 6 also shows that the second voltage $V_{out}$ is restricted by the reference voltage $V_{ref}$ during the period from a point of time $T_{start}$ at which boosting or lowering of the second voltage $V_{out}$ is started to the point of time $T_{end}$ at which the second voltage $V_{out}$ reaches the target value.

That is, in the same manner as the above-mentioned first embodiment, the voltage boosting condition (the change rate of reference voltage, current supply capability of the voltage boosting circuit, the load capacitance or the like, for example) is set such that the third voltage $V_{mon}$ is brought into a state where the third voltage $V_{mon}$ exceeds the reference voltage $V_{ref}$.

In this case, the operation of the voltage boosting circuit is restricted by the differential amplifier circuit so that the third voltage $V_{mon}$ always maintains a state where the third voltage $V_{mon}$ is equal to or substantially equal to the reference voltage $V_{ref}$. Accordingly, the second voltage $V_{out}$ is boosted following the boosting of the reference voltage $V_{ref}$ until the second voltage $V_{out}$ reaches the target value.

A power source voltage for driving the voltage boosting circuit 0A is, for example, an internal power source voltage $V_{dd}$. A power source voltage for driving the voltage lowering circuit 0B is, for example, an external power source voltage $V_{ext}$. That is, what makes the voltage boosting circuit 0A and the voltage lowering circuit 0B differ from each other is that the value of the power source voltage for driving the voltage boosting circuit 0A and the value of the power source voltage for driving the voltage lowering circuit 0B differ from each other. The voltage lowering circuit 0B performs the voltage lowering operation, and the term "voltage lowering circuit" is used in the context that the voltage lowering circuit outputs a voltage lower than the external power source voltage $V_{ext}$, which is a drive power source for the voltage lowering circuit 0B.

In FIG. 6, the boosting rate of the second voltage $V_{out}$ which is the output voltage of the voltage boosting circuit 0A is depicted by "a" and the absolute value of the lowering rate of the second voltage $V_{out}$ which is the output voltage of the voltage lowering circuit 0B is depicted by "b". The boosting rate and the lowering rate follow the change rate of the reference voltage $V_{ref}$ and hence, the boosting rate "a" and the absolute value of the lowering rate "b" are shown to be equal.

In this manner, according to this embodiment, the change rate of the reference voltage $V_{ref}$ can be controlled with high accuracy during the period from the point of time at which boosting or lowering of the second voltage (the boost voltage, for example) $V_{out}$ is started to the point of time at which the second voltage reaches the target value.

For example, in a nonvolatile semiconductor memory circuit, it may be necessary for a second voltage $V_{out}$, which is an output voltage of a voltage boosting circuit, to reach a target value within a period from a point of time at which a write or erase operation instruction is received to a point of time at which the write or erase operation is executed (the elapsed time known as latency).

Figure 7:
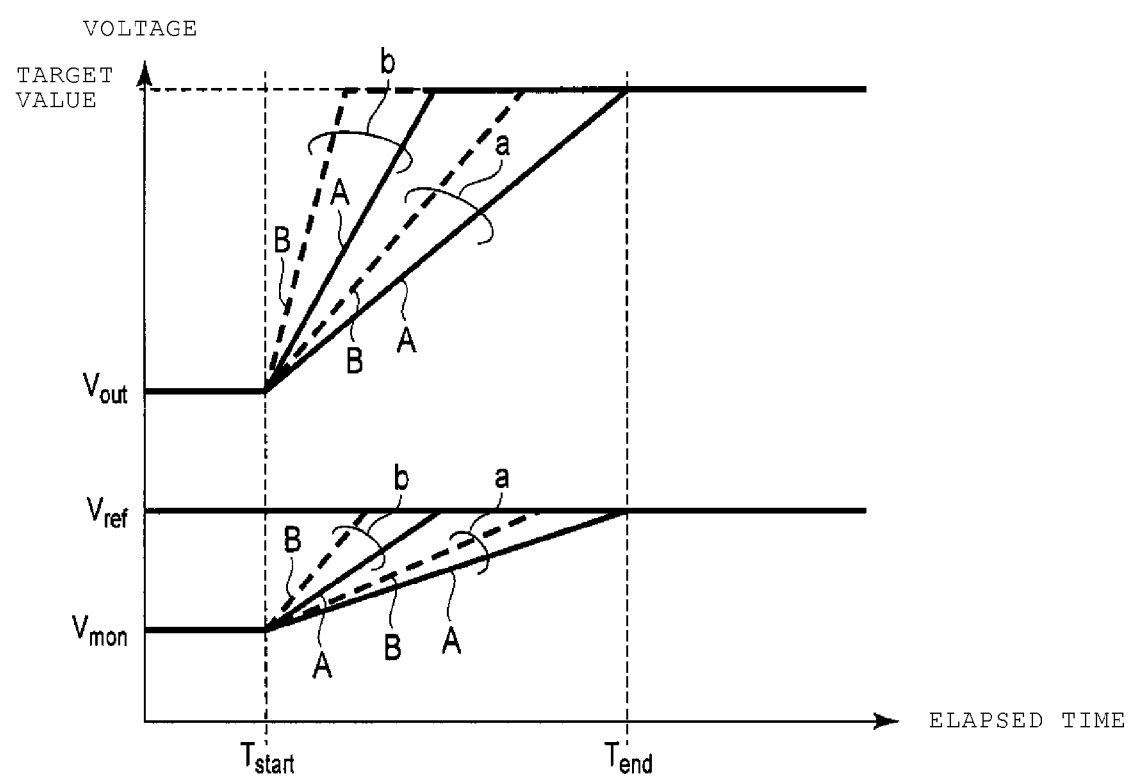
FIG. 7 is a graph showing the relationship between a reference voltage and an output voltage in a second comparison example.

FIG. 7 shows an example of the relationship between the change rate of the reference voltage $V_{ref}$ and the change rate of the second voltage $V_{out}$ in a comparison example.

The relationship shown in FIG. 7 differs from the relationship shown in FIG. 6 with respect to a point that the reference voltage $V_{ref}$ is a constant value in the relationship shown in FIG. 7.

In this case, the second voltage $V_{out}$ is not restricted by the reference voltage $V_{ref}$ during the period from the point of time $T_{start}$ at which boosting or lowering of the second voltage $V_{out}$ is started to the point of time $T_{end}$ at which the second voltage $V_{out}$ reaches the target value. The second voltage $V_{out}$ is restricted by the reference voltage $V_{ref}$ on and after the point of time $T_{end}$.

Accordingly, the change rate of the second voltage $V_{out}$ is determined based on current supply capability of the voltage boosting circuit and the load capacitance. Assuming that current supply capability of the voltage boosting circuit is constant, the change rate of the second voltage $V_{out}$ changes according to the load capacitance.

For example, with respect to the boosting rate (the change rate) "a" of the voltage boosting circuit, a solid line A indicates a case where a load capacitance which is connected to an output terminal of the voltage boosting circuit is large, and a broken line B indicates a case where the load capacitance which is connected to the output terminal of the voltage boosting circuit is small. That is, the time needed for the second voltage $V_{out}$ to reach the target value is long when the load capacitance is large, and the time needed for the second voltage $V_{out}$ to reach the target value is short when the load capacitance is small.

For example, with respect to the boosting rate (the change rate) "b" of the voltage lowering circuit, a solid line A indicates a case where the load capacitance which is connected to the output terminal of the voltage lowering circuit is large, and a broken line B indicates a case where the load capacitance which is connected to the output terminal of the voltage lowering circuit is small. That is, the time needed for the second voltage $V_{out}$ to reach the target value is long when the load capacitance is large, and the time needed for the second voltage $V_{out}$ to reach the target value is short when the load capacitance is small.

This delay in timing at which the second voltage $V_{out}$ reaches the target value is not desirable from a viewpoint of enhancing characteristics of the semiconductor integrated circuit.

When the reference voltage $V_{ref}$ is at a constant value, at the point of time $T_{end}$ at which the restriction of the second voltage $V_{out}$ by the reference voltage $V_{ref}$ starts, the so-called overshoot occurs. Such an overshoot generates an unintended large voltage stress on a gate insulation film of an element, for example, an FET (including a memory cell) in the semiconductor integrated circuit, and this voltage stress causes a failure such as breaking of the element.

To the contrary, as shown in FIG. 6, by making the second voltage $V_{out}$ follow the reference voltage $V_{ref}$ until the second voltage $V_{out}$ reaches the target value, a drawback such as delay in timing at which the second voltage $V_{out}$ reaches such a target value or the overshoot can be eliminated.

According to the embodiment described heretofore, the change rate of the reference voltage $V_{ref}$ can be controlled with high accuracy during the period from the point of time at which boosting or lowering of a second voltage (boost voltage, for example) $V_{out}$ is started to the point of time at which the second voltage $V_{out}$ reaches the target value.

3. Third Embodiment

The third embodiment differs from the first and second embodiments with respect to the generation of the reference voltage $V_{ref}$ and a method of controlling the reference voltage $V_{ref}$.

In the first and second embodiments, the semiconductor integrated circuit does not have a function of controlling the boosting of the reference voltage $V_{ref}$ and hence, the reference voltage $V_{ref}$ is boosted up to the internal power source voltage $V_{dd}$.

To the contrary, in the third embodiment, the semiconductor integrated circuit has a function of controlling the boosting of the reference voltage $V_{ref}$ and hence, the boosting of the reference voltage $V_{ref}$ can be stopped at a voltage value lower than the internal power source voltage $V_{dd}$.

Other constitutions are substantially equal to the corresponding constitutions in the first and second embodiments and hence, the detailed explanation of such constitutions is omitted.

Figure 11:
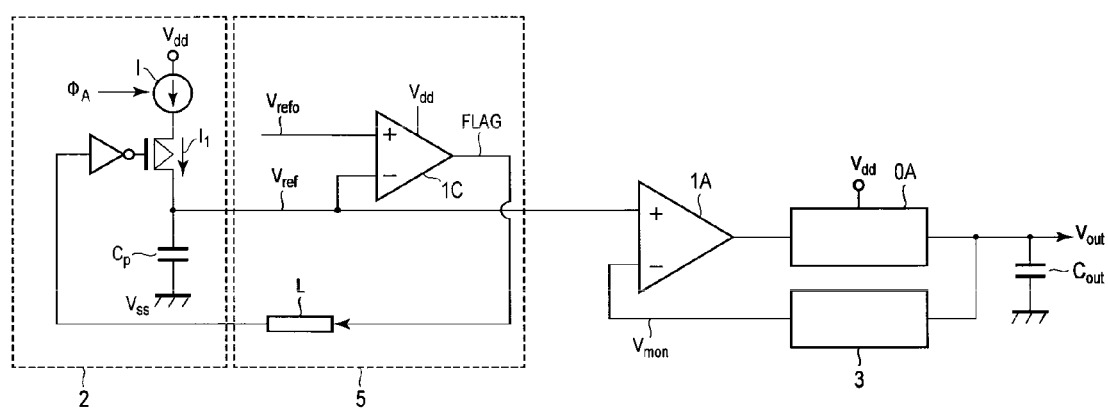
FIG. 11 is a block diagram showing a semiconductor integrated circuit according to a third embodiment.

FIG. 11 shows a semiconductor integrated circuit according to the third embodiment.

The semiconductor integrated circuit according to the third embodiment includes a reference voltage generation circuit 2 and a reference voltage control circuit 5.

The reference voltage control circuit 5 includes an operational amplifier 1C and a logic circuit L. The reference voltage control circuit 5 generates a detection (FLAG) signal based on a comparison between the reference voltage $V_{ref}$ and a standard voltage $V_{refo}$ of the reference voltage in the operational amplifier (differential amplifier) 1C.

The detection (FLAG) signal is inputted to the logic circuit L, and is outputted as a switch gate signal. The logic circuit L may be omitted when required.

The switch gate signal is supplied to the reference voltage generation circuit 2.

The reference voltage generation circuit 2 includes a variable current source I, a switch transistor and a capacitor Cp which are connected in series. A switch gate signal is inputted to a gate electrode of the switch transistor through an inverter. The variable current source I is controlled using a current value adjustment signal φA.

Figure 12:
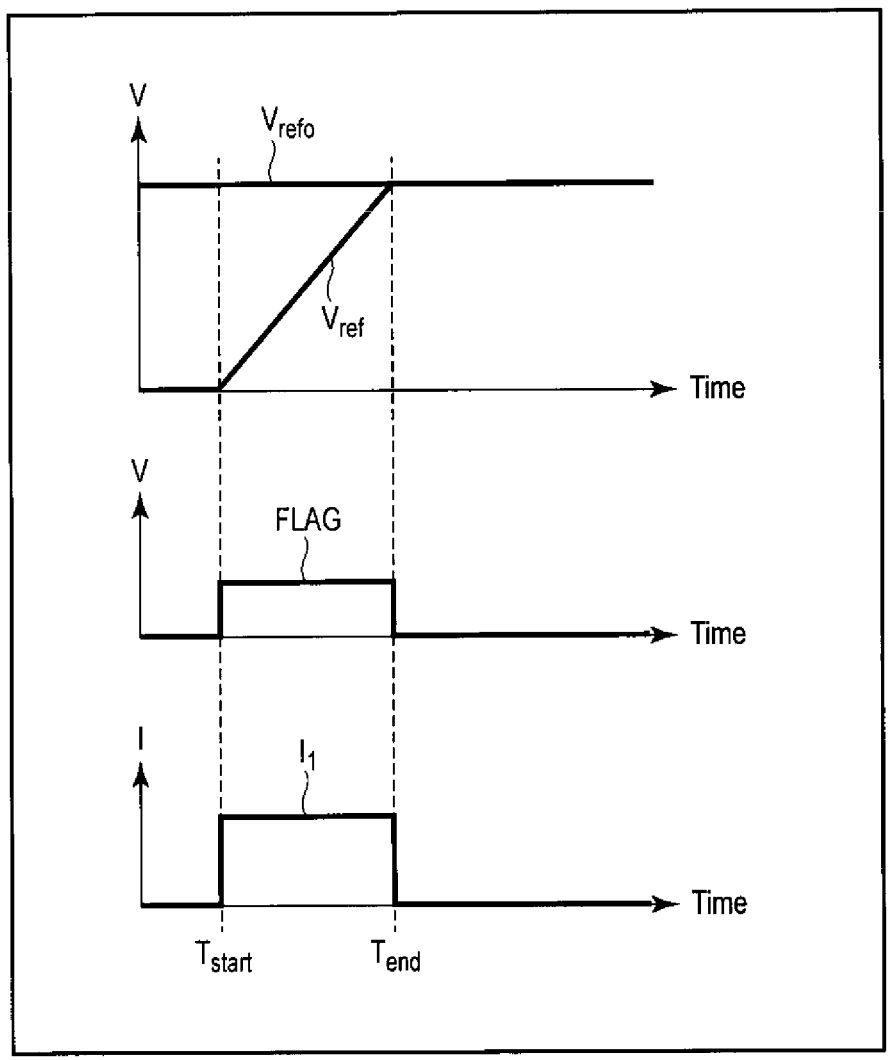
FIG. 12 is an explanatory view showing a control of a reference voltage used in the third embodiment.

FIG. 12 shows the control of the reference voltage $V_{ref}$ used in the third embodiment. An elapsed time is taken on an axis of abscissas, and a voltage and a current are taken on an axis of ordinates.

As can be clearly understood from FIG. 12, the change rate of the reference voltage $V_{ref}$ is constant, and the reference voltage $V_{ref}$ changes linearly. The reference voltage $V_{ref}$ is boosted by receiving the supply of an ON current $I_1$ based on the detection (FLAG) signal during the period from the point of time $T_{start}$ at which boosting of the reference voltage $V_{ref}$ is started to the point of time $T_{end}$ at which the reference voltage $V_{ref}$ reaches the standard voltage $V_{refo}$ of the reference voltage.

For example, in a nonvolatile semiconductor memory circuit, it may be necessary for a reference voltage $V_{ref}$ to reach a standard voltage of a reference voltage within a period from a point of time at which a write or erase operation instruction is received to a point of time at which the write or erase operation is executed (the elapsed time known as latency).

The standard voltage $V_{refo}$ of the reference voltage is a voltage having a voltage value smaller than an internal power source voltage $V_{dd}$. The standard voltage $V_{refo}$ of the reference voltage is originally generated by a reference voltage generation circuit (for example, a band gap reference voltage) provided to a memory chip.

For example, when a switch transistor is a PMOS transistor, the reference voltage $V_{ref}$ is controlled as follows.

When the reference voltage $V_{ref}$ has a voltage value smaller than the standard voltage $V_{refo}$ of the reference voltage, a detection (FLAG) signal becomes High (H). That is, when the relationship of $V_{ref} < V_{refo}$ is established, FLAG (H) is set. The detection (FLAG) signal is converted into a Low level from a High level through an inverter and is inputted to a gate electrode of a switch transistor. At this point of time, the switch transistor is turned on so that a constant current $I_1$ (ON current) is supplied to a capacitor Cp from a variable current source I. Accordingly, the reference voltage is boosted.

When the reference voltage $V_{ref}$ has a voltage value equal to or larger than the standard voltage $V_{refo}$ of the reference voltage, the detection (FLAG) signal becomes Low (L). That is, when the relationship of $V_{ref} \geq V_{refo}$ is established, FLAG (L) is set. The detection (FLAG) signal is converted into a High level from a Low level through the inverter and is inputted to the gate electrode of the switch transistor. At this point of time, the switch transistor is turned off so that the constant current $I_1$ (ON current) is not supplied to the capacitor Cp. Accordingly, the boosting of the reference voltage is stopped.

In this manner, according to the third embodiment, by restricting the boosting of the reference voltage $V_{ref}$ based on the standard voltage $V_{refo}$ of the reference voltage, the boosting of the reference voltage $V_{ref}$ can be stopped before the reference voltage $V_{ref}$ reaches the internal power source voltage $V_{dd}$.

Figure 13:
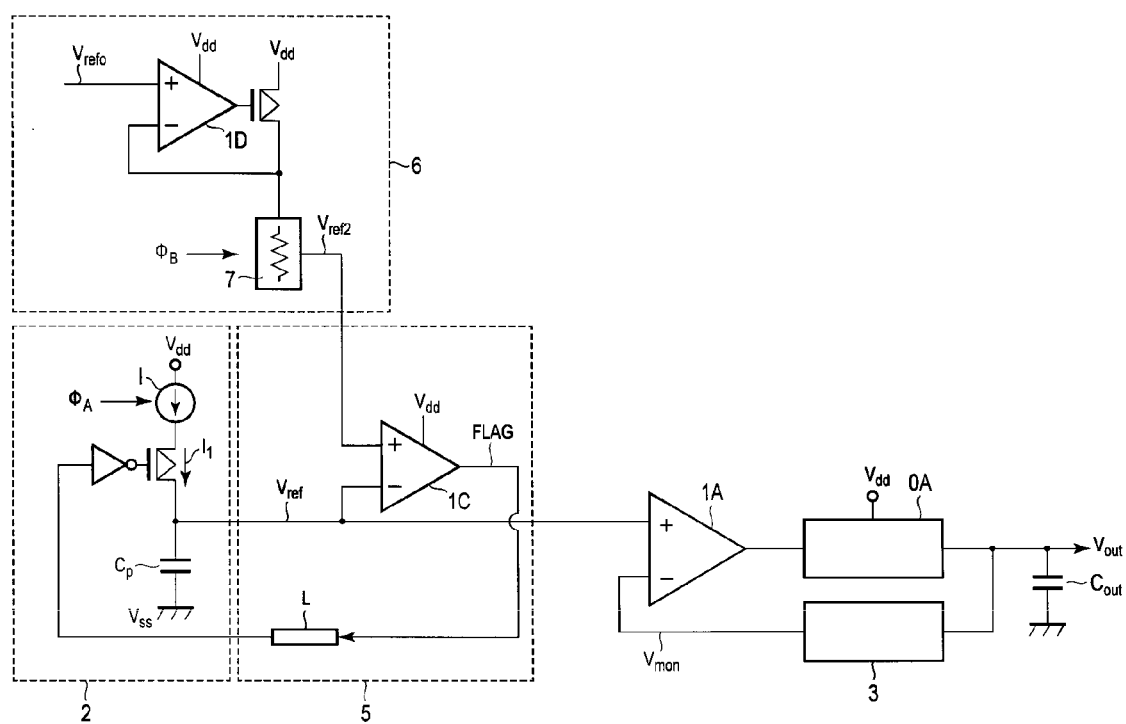
FIG. 13 is a block diagram showing a modified semiconductor integrated circuit according to the third embodiment.

FIG. 13 shows a modified semiconductor integrated circuit according to the third embodiment.

The reference voltage is restricted to the voltage value $V_{ref2}$ obtained by dividing the standard voltage $V_{refo}$ of the reference voltage.

In the third embodiment, a voltage value of the standard voltage $V_{refo}$ of the reference voltage is constant and hence, the change rate of the reference voltage $V_{ref}$ cannot be changed in the midst of a change of the change rate corresponding to the voltage.

To the contrary, in the modification of the third embodiment, the voltage value of the standard voltage $V_{refo}$ of the reference voltage can be changed based on a voltage dividing ratio by dividing the standard voltage $V_{refo}$ of the reference voltage. Accordingly, the change rate of reference voltage $V_{ref}$ can be changed in the midst of the change of the change rate corresponding to the voltage.

Other constitutions are substantially equal to the corresponding constitutions in the third embodiment and hence, the detailed explanation of such constitutions is omitted.

FIG. 13 shows the modified semiconductor integrated circuit according to the third embodiment.

The modified semiconductor integrated circuit according to the third embodiment includes a reference voltage generation circuit 2, a reference voltage control circuit 5, and a circuit 6 which divides the standard voltage $V_{refo}$ of the reference voltage.

The circuit 6 which divides the standard voltage $V_{refo}$ of the reference voltage includes a transistor (for example, PMOS), an operational amplifier 1D, and a voltage divider circuit 7. The voltage divider circuit 7 is adjusted based on a voltage dividing ratio adjustment signal φB.

With respect to source and drain electrodes of the transistor, one electrode is connected to an internal power source voltage $V_{dd}$, and the other electrode is connected to the voltage divider circuit 7. A gate electrode of the transistor is connected to the operational amplifier 1D.

The operational amplifier 1D inputs a gate signal to the gate electrode of the transistor based on a comparison between the standard voltage $V_{refo}$ of the reference voltage and the output voltage of the transistor.

A portion of an output voltage of the transistor is divided by the voltage divider circuit 7 (a divided voltage $V_{ref2}$), and the divided voltage $V_{ref2}$ is inputted to the operational amplifier 1C of the reference voltage control circuit 5.

The operational amplifier 1C of the reference voltage control circuit 5 outputs a detection (FLAG) signal based on a comparison between the divided voltage $V_{ref2}$ and the reference voltage $V_{ref}$.

A switch transistor of the reference voltage generation circuit 2 is turned on or off in response to the detection (FLAG) signal.

The boosting of the reference voltage is controlled by turning on or off the switch transistor.

Figure 14:
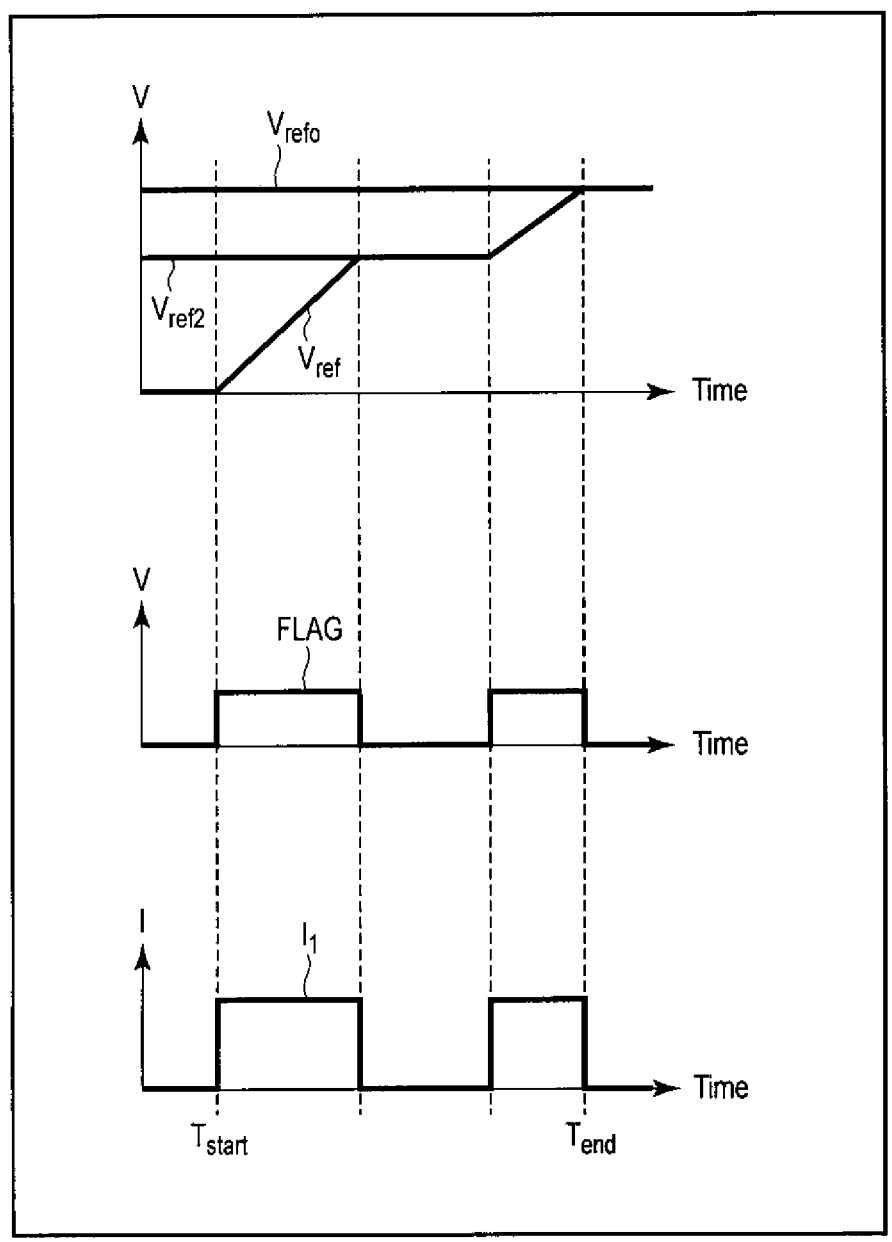
FIG. 14 is an explanatory view showing a control of a reference voltage used in the modified third embodiment.

FIG. 14 is an explanatory view showing a control of the reference voltage $V_{ref}$ used in the modification of the third embodiment.

When the reference voltage $V_{ref}$ is smaller than the divided voltage $V_{ref2}$, the switch transistor is turned on so that the reference voltage $V_{ref}$ is boosted. On the other hand, when the reference voltage $V_{ref}$ is equal to or larger than the divided voltage $V_{ref2}$, the switch transistor is turned off so that the boosting of the reference voltage $V_{ref}$ is stopped.

Further, by controlling timing at which the change rate of the reference voltage $V_{ref}$ is changed by a timer circuit, the change rate of the reference voltage $V_{ref}$ can be changed in the midst of the change of the change rate of the reference voltage $V_{ref}$ corresponding to an elapsed time.

The above-mentioned embodiments are applicable to semiconductor integrated circuits used in general.

Hereinafter, the explanation is made with respect to an example where the above-mentioned embodiments are applied to a nonvolatile semiconductor memory circuit which includes: a memory cell array having a plurality of planes; and a selection circuit which selects at least one plane out of the plurality of planes.

In the nonvolatile semiconductor memory circuit having such a constitution, a load capacitance which is connected to an output terminal of a voltage boosting or lowering circuit changes depending on the number of planes selected by the selection circuit (the number of selected planes being one or more) (operation mode). By applying the above-mentioned embodiments to such a case, the reliability of the nonvolatile semiconductor memory circuit can be enhanced.

When each of the plurality of planes includes a memory cell having a charge storage layer and a control gate electrode, and a word line connected to the control gate electrode, the load capacitance which is connected to the output terminal of the voltage boosting or lowering circuit is mainly formed of a parasitic capacitance which is generated in the word line in at least one plane selected by the selection circuit.

Figure 8:
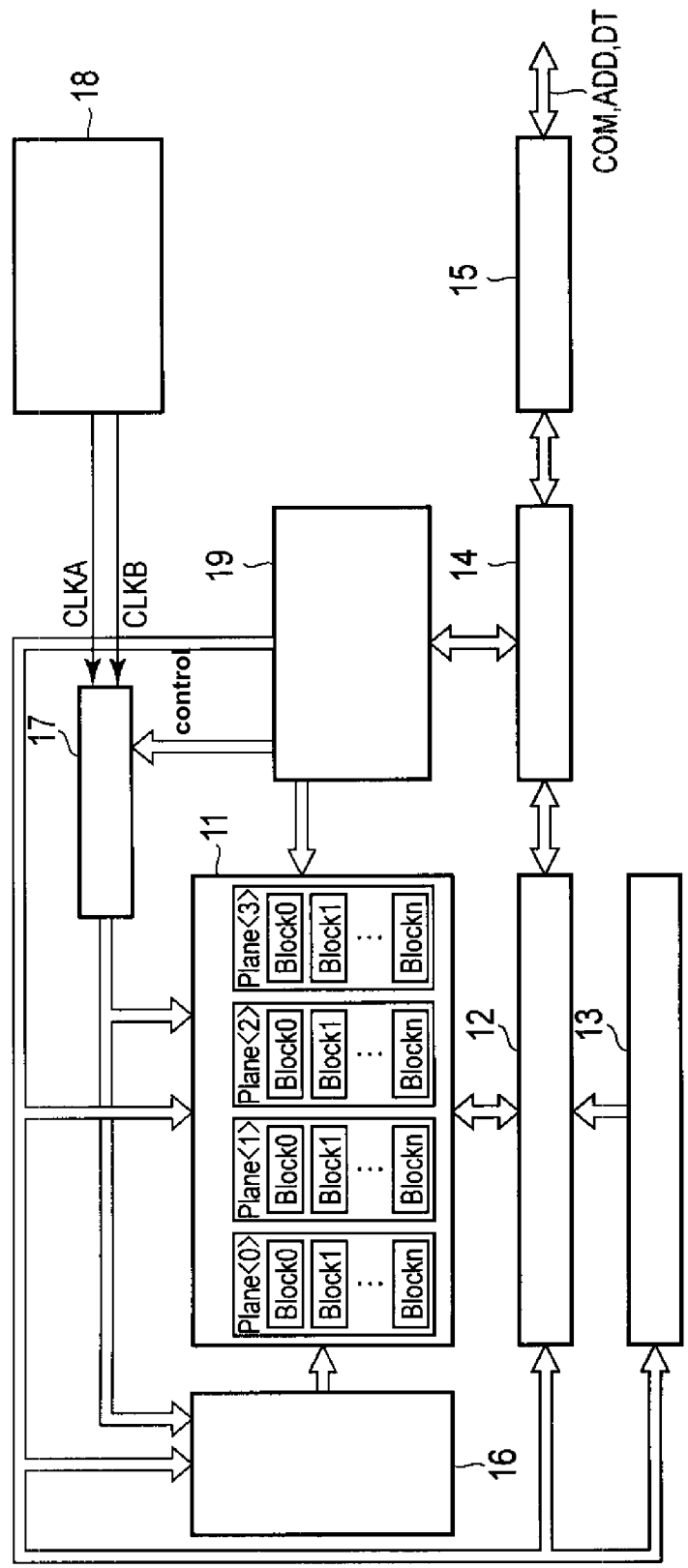
FIG. 8 is a block diagram showing a nonvolatile semiconductor memory circuit to which embodiments may be applied.

FIG. 8 shows a nonvolatile semiconductor memory circuit.

A memory cell array 11 includes a plurality of planes Plane <0> to Plane <3>. Each plane Plane<0:3> includes a plurality of blocks Block 0 to Block n. A bit line control circuit 12 controls a voltage of bit lines in the memory cell array 11. A column decoder 13 selects one of the plurality of planes, Plane <0> to Plane <3>, for example.

A data input and output buffer 14 functions as a buffer for input and output data, and a data input and output terminal 15 functions as an interface of input and output data. In this application example, the input and output data includes a command COM, an address ADD, file data DT and the like.

The word line control circuit 16 controls, for example, voltages of plurality of word lines in at least one selected plane out of the plurality of planes, Plane <0> to Plane <3>.

A voltage generation circuit 17 includes the voltage boosting or lowering circuit relating to the above-mentioned embodiment. The voltage generation circuit 17 generates, for example, a predetermined voltage to be applied to a plurality of word lines in at least one selected plane out of the plurality of planes, Plane <0> to Plane <3>.

For example, at the time of the write operation, the voltage generation circuit 17 generates a write voltage to be applied to the selected word line in at least one selected plane, while at the time of the read operation, the voltage generation circuit 17 generates a read voltage to be applied to the selected word line in at least one selected plane.

A clock generating circuit 18 generates clock signals CLKA, CLKB for controlling the operation of the voltage generation circuit 17. The voltage generation circuit 17 is a charge pump circuit, for example, and the charge pump circuit is controlled in response to the clock signals CLKA, CLKB.

A control circuit 19 controls operations of a memory cell array 11, a bit line control circuit 12, a column decoder 13, a data input and output buffer 14, a word line control circuit 16 and a voltage generation circuit 17.

In the nonvolatile semiconductor memory circuit having such a constitution, the control circuit 19 controls the operation of the voltage generation circuit 17 corresponding to an operation mode, for example.

For example, in an operation mode where all of the plurality of planes, Plane <0> to Plane <3>, are selected, the control circuit 19 controls the operation of the reference voltage generation circuits 2 shown in FIG. 1 and FIG. 5 and described in the above-mentioned embodiment based on a load capacitance $C_{out}$ ($=C_{max}$) at which all of the plurality of planes, Plane <0> to Plane <3>, are selected.

Further, for example, in an operation mode where one of the plurality of planes, Plane <0> to Plane <3>, is selected, the control circuit 19 controls the operation of the reference voltage generation circuits 2 shown in FIG. 1 and FIG. 5 and described in the above-mentioned embodiment based on a load capacitance $C_{out}$ ($=C_{min}$) at which one of the plurality of planes Plane <0> to Plane <3> is selected.

It may be also possible that a control method performed by the reference voltage generation circuit 2 corresponding to an operation mode is programmed in advance, and the control circuit 19 controls the operation of the reference voltage generation circuit 2 shown in FIG. 1 and FIG. 5 and described in the above-mentioned embodiment based on the program.

Figure 9:
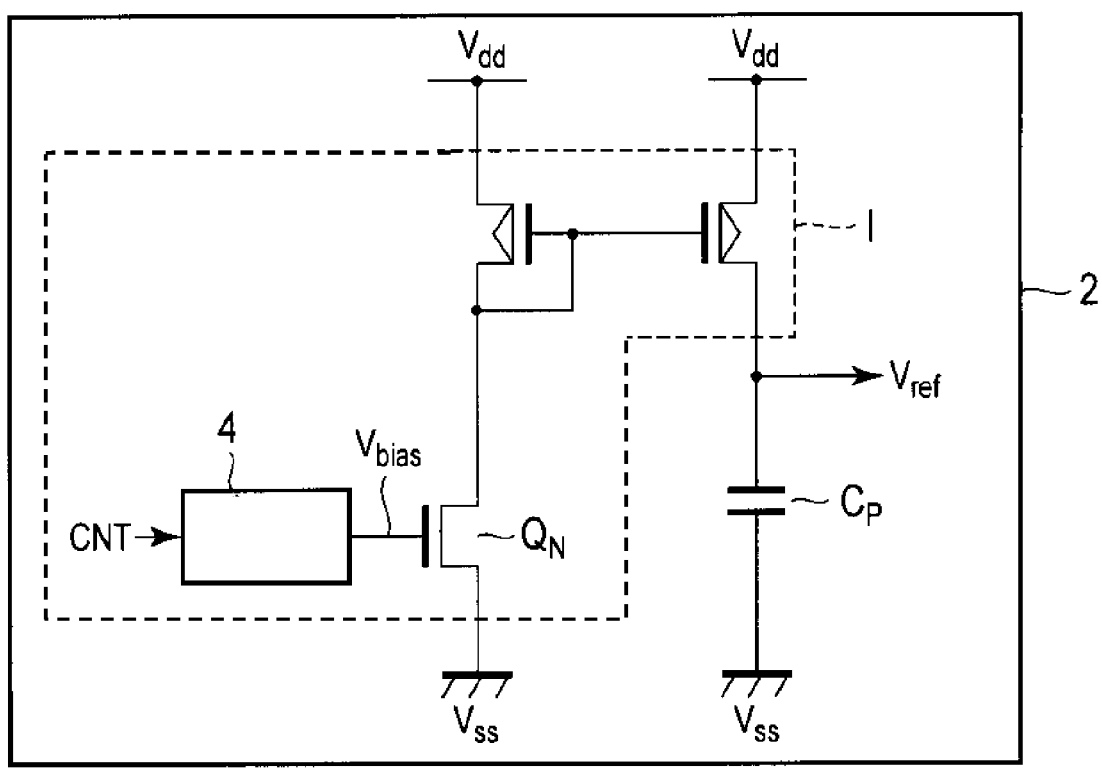
FIG. 9 is a circuit diagram showing an example of a reference voltage generation circuit.

FIG. 9 shows an example of the reference voltage generation circuit 2.

A variable current source I is constituted of a current mirror circuit. This circuit is characterized in that a current value of the variable current source I is controlled based on a value of a bias voltage $V_{bias}$ to be applied to a gate of an N channel FET $Q_N$.

The bias voltage $V_{bias}$ is generated by a bias voltage generating circuit 4. The bias voltage generating circuit 4 controls a value of the bias voltage $V_{bias}$ based on a control signal CNT transmitted from the control circuit 19 shown in FIG. 8, for example. Due to such a control, a current value of the variable current source I is changed so that a change rate of a reference voltage $V_{ref}$ is controlled.

Figure 10:
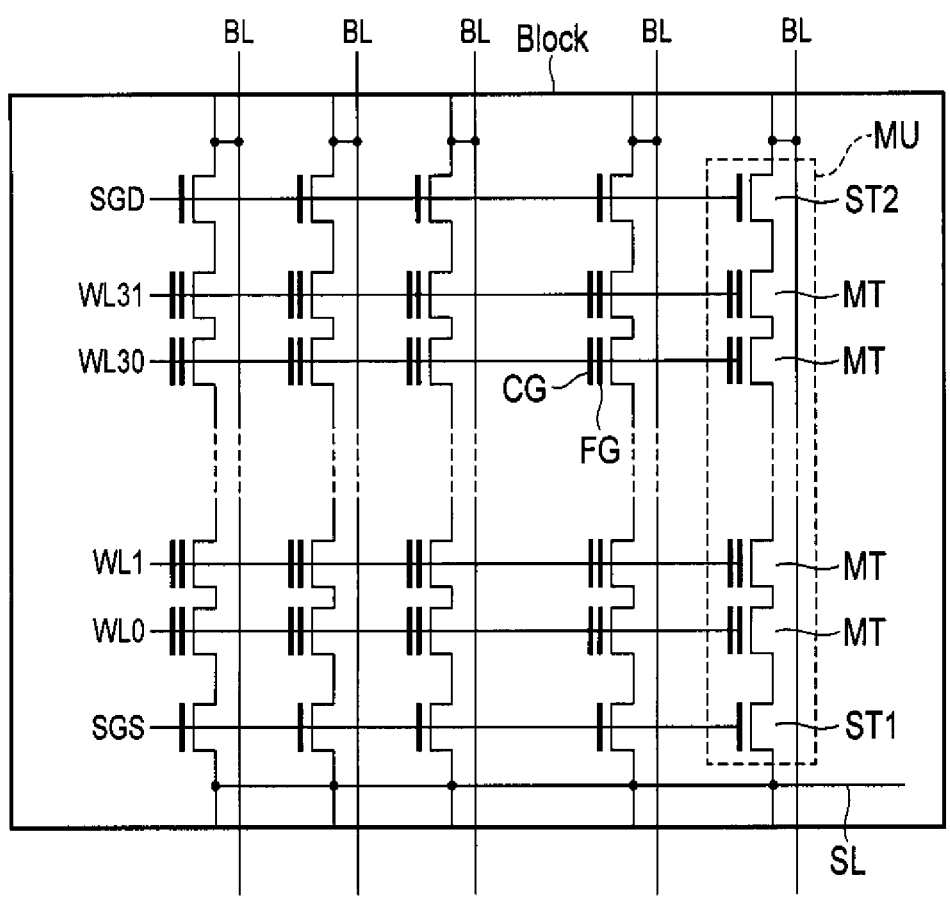
FIG. 10 is a diagram showing an example of a block of memory cell units.

FIG. 10 shows an example of a block of memory cell units shown in FIG. 8.

One block, Block, includes memory cell units MU. Each memory cell unit MU includes a NAND string having a plurality of memory cells MT which are connected in series and two selection transistors ST1, ST2 which are connected to both ends of the NAND string respectively.

Each of the plurality of memory cells MT is formed of a flash memory cell having a charge storage layer and a control gate electrode, and the control gate electrode is connected to one of word lines WL0 to WL31. A gate electrode of the selection transistor ST1 is connected to a selection gate line SGS, and a gate electrode of the selection transistor ST2 is connected to a selection gate line SGD.

One end of the memory cell unit MU is connected to the bit line BL, and the other end of the memory cell unit MU is connected to the source line SL.

As explained above, according to the above-mentioned embodiments, a boosting rate of a voltage outputted from the voltage boosting or lowering circuit can be controlled with high accuracy.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor integrated circuit comprising:
   a reference voltage generation circuit configured to generate a reference voltage;
   a first differential amplifier circuit configured to compare a monitored voltage generated from a voltage that is applied to a load capacitance, with the reference voltage and output a first difference signal;
   a second differential amplifier circuit configured to compare the monitored voltage with the reference voltage and output a second difference signal;
   a voltage boosting circuit configured to generate a boosted voltage that is applied to the load capacitance from a first power supply voltage based on the first difference signal; and
   a voltage lowering circuit configured to generate a lowered voltage that is applied to the load capacitance from a second power supply voltage based on the second difference signal, wherein
   the reference voltage generation circuit includes a variable current source and a capacitor which are connected in series, and is configured to change the reference voltage linearly.

2. The semiconductor integrated circuit according to claim 1, wherein the reference voltage generation circuit is controlled to change the reference voltage linearly during a period from a point of time at which changing of the voltage applied to the load capacitance is started to a point of time at which the changed voltage reaches a predetermined value.

3. The semiconductor integrated circuit according to claim 1, wherein
   the reference voltage generation circuit is controlled to change the reference voltage at a first change rate during a first time period and at a second change rate that is different from the first change rate during a second time period.

4. The semiconductor integrated circuit according to claim 1, further comprising:
   a memory cell array including a plurality of planes of memory cells; and
   a selection circuit configured to select at least one of the planes,
   wherein the load capacitance changes depending on a number of planes selected by the selection circuit.

5. The semiconductor integrated circuit according to claim 4, wherein
   the reference voltage generation circuit is controlled to change the reference voltage at a change rate that is determined according to the number of planes selected by the selection circuit.

6. A semiconductor integrated circuit comprising:
   a reference voltage generation circuit including a variable current source and a capacitor which are connected in series;
   a first differential amplifier circuit having a first input electrically connected to an output of the reference voltage generation circuit to receive a reference voltage generated by the reference voltage generation circuit, a second input to which a monitored voltage generated from an output voltage is supplied, wherein the first differential amplifier circuit generates a first difference signal based on a difference between the reference voltage and the monitored voltage;
   a second differential amplifier circuit having a first input electrically connected to the output of the reference voltage generation circuit to receive the reference voltage generated by the reference voltage generation circuit, a second input to which the monitored voltage is supplied, wherein the second differential amplifier circuit generates a second difference signal based on a difference between the reference voltage and the monitored voltage;
   a voltage boosting circuit that boosts the output voltage based on a first power supply voltage and on the first difference signal; and
   a voltage lowering circuit that lowers the output voltage based a second power supply voltage and on the second difference signal.

7. The semiconductor integrated circuit according to claim 6, wherein the reference voltage generation circuit is controlled to change the reference voltage linearly during a period from a point of time at which changing of the output voltage is started to a point of time at which the changed output voltage reaches a predetermined value.

8. The semiconductor integrated circuit according to claim 6, wherein
the reference voltage generation circuit is controlled to change the reference voltage at a first change rate during a first time period and at a second change rate that is different from the first change rate during a second time period.

9. The semiconductor integrated circuit according to claim 6, further comprising:
a memory cell array including a plurality of planes of memory cells; and
a selection circuit configured to select at least one of the planes,
wherein the output voltage is changed depending on a number of planes selected by the selection circuit.

10. The semiconductor integrated circuit according to claim 9, wherein
the reference voltage generation circuit is controlled to change the reference voltage at a change rate that is determined according to the number of planes selected by the selection circuit.

* * * * *